United States Patent [19]
Ahn

[11] Patent Number: 5,158,905
[45] Date of Patent: Oct. 27, 1992

[54] METHOD FOR MANUFACTURING A SEMICONDUCTOR DEVICE WITH VILLUS-TYPE CAPACITOR

[75] Inventor: Ji-hong Ahn, Seoul, Rep. of Korea

[73] Assignee: Samsung Electronics Corp., Ltd., Suwon, Rep. of Korea

[21] Appl. No.: 715,796

[22] Filed: Jun. 14, 1991

[30] Foreign Application Priority Data

Nov. 29, 1990 [KR] Rep. of Korea .................. 90-19471

[51] Int. Cl.[5] .......................................... H01L 21/70
[52] U.S. Cl. ........................................ 437/52; 437/47; 437/48; 437/60; 437/228; 437/233; 437/235; 437/919; 357/236
[58] Field of Search ................. 437/47, 48, 52, 60, 437/228, 229, 233, 235, 919; 156/659.1; 430/313, 322, 323

[56] References Cited

U.S. PATENT DOCUMENTS 4,906,590 3/1990 Kanetaki et al. .................. 437/229

OTHER PUBLICATIONS

T. Mine et al., "Capacitance enhanced stacked capacitor with engraved storage electrode for deep submicron DRAMS." Abs. of 21st Conf. on Solid State Devices and Materials, Tokyo 1989 pp. 137–140.

Stacked Capacitor DRAM Cell with Vertical Lims (VF-STC), IBMTDB, vol. 33, No. 2 Jul. 1990.

Primary Examiner—Tom Thomas
Attorney, Agent, or Firm—Morgan & Finnegan

[57] ABSTRACT

A method for manufacturing a villus-type capacitor of a semiconductor memory device formed by stacking a storage electrode, a dielectric film and a plate electrode on a semiconductor substrate further comprising the steps of forming a first conductive layer by depositing a conductive material on the semiconductor substrate; covering the first conductive layer with a second material having grains of a first material; selectively removing the second material using the grains of the first material as a mask; etching a predetermined portion of the first conductive layer using a grain pattern formed by removing the second material as a mask; removing the grain pattern; completing the formation of a storage electrode by defining into each unit cell the villus-formed first conductive layers on the surface of the device utillizing an etching process; forming the dielectric film over the surface of the storage electrode; and forming the plate electrode by depositing a second conductive layer over the dielectric film. The pillar-shaped storage electrode having dimensions below design rules and a buried bit line extend the capacitor's surface, resulting in an effective increase of capacitive area, and a corresponding increase in the cell capacitance.

7 Claims, 4 Drawing Sheets

METHOD FOR MANUFACTURING A SEMICONDUCTOR DEVICE WITH VILLUS-TYPE CAPACITOR

BACKGROUND OF THE INVENTION

The present invention relates to a method for manufacturing a semiconductor device, and particularly to a method for manufacturing a semiconductor device with a villus-type capacitor that is capable of increasing the capacitance of a memory cell.

Remarkable developments have been achieved in Dynamic Random Access Memory ("DRAMs") which may be used to further increase the packing density of semiconductor devices, by producing an individual memory cell having a single capacitor and a single transistor. The packing density of semiconductor devices has been quadrupling roughly every three years, along side the progress being made in other areas of semiconductor technology. At present, 4 Mbit DRAMs are in mass production, 16 Mbit DRAMS are in the trial stages for mass production, and 64 Mbit and 256 Mbit DRAMs are under active study for development.

In order to store and retrieve information in a semiconductor memory device, a minimum cell capacitance is required. However, when the packing density of the semiconductor device is increased by a factor four, chip size increases only by 40%. Accordingly, the allotted area for each memory cell is reduced to nearly one third of its previous size. As a result, the conventional capacitor structure is not sufficient for newly-developed memory cells to obtain the required cell capacitance. Therefore, the many problems which are created by the increase in the requisite cell capacitance according to the attainment of higher packing density, remain to be solved.

Two-dimensional planar-type capacitor structures, along with three-dimensional capacitor structures such as trench-type capacitors, stack-type capacitors, and combined stack-trench type capacitors, have all been cited as technologies that may be used to increase the capacitance of memory cells. However, the increased packing density called for in 64 Mbit and 256 Mbit units causes difficulties in achieving sufficient capacitance by the use of simple three-dimensional capacitors. To overcome this problem, a number of modified three-dimensional capacitor structures have been developed, such as the fin-type capacitor structures by Fujutsu Laboratories, the BOX-type (Buried Oxide isolation) capacitor, the SSC (Spread Stacked Capacitor) structures by Toshiba ULSI Laboratories, and cylinder-type capacitor structures by Mitsubishi LSI Laboratories. These capacitors supposedly can attain sufficient cell capacitance for 64 Mbit DRAMs.

On the other hand, a villus-type capacitor structure is formed in such a manner that the storage electrodes formed on source regions are in the shape of pillars whose dimensions are below design rules. Because the capacitance provided by the storage electrodes is formed by sub-design rule pillars, the problem of not achieving sufficient capacitance due to design rules is eliminated. Accordingly, sufficient cell capacitance for 64 Mbit and 256 Mbit DRAMs may be obtained. Mitsubishi Ltd., of Japan has designed a semiconductor memory device having a villus-type capacitor structure.

Conventional semiconductor memory devices having a villus-type capacitor structure are known in the art, and one such type of memory device is illustrated in FIG. 1. A method for manufacturing such villus-type capacitors will be described below in order to provide a better understanding of the present invention.

Referring now to FIG. 1, the conventional semiconductor memory device generally comprises: a field oxide layer 2 for separating an active region from an isolation region of the device; a switching transistor formed of a source region 3, drain region 4 and a gate electrode 6 on an interposing gate oxide layer 5; a storage electrode 11 comprising pillar-shaped electrodes (with dimensions below design rules) in contact with the source region of the switching transistor; a dielectric film 13 that forms a coating over both the source region and the entire pillar-shaped storage electrodes; a second conductive layer 14 covering the whole surface of the dielectric film, forming a plate electrode; an insulating layer 15 adjacent to the upper portions of the second conductive layer and the gate electrode, for isolating the second conductive layer from a bit line; and a bit line 7 formed in contact with drain region 4.

A method for manufacturing a conventional semiconductor memory device with the villus-type capacitor structure is performed as follows.

Gold is implanted through a FIB (Focus Ion Beam) method, using a beam diameter of 0.1 $\mu$m in the source region of the switching transistor formed from source region 3, drain region 4, and gate electrode 6 on the interposing gate oxide layer 5. Silicon is then deposited on the device through known deposition methods, such as CVD (Chemical Vapor Deposition) or Vacuum Evaporation. Next, a semiconductor substrate 1 is annealed at very high temperatures, such as 1000° C. The crystallized silicon is then grown in the shape of pillars, but only in the areas where gold has been implanted. Since the gold will have accumulated around the upper portions of the pillars, it can be selectively removed by aqua regia ($HNO_3 + HCl$) to form the storage electrode composed of the pillars of dimensions below design rules.

A dielectric material is then coated over the whole surface of the pillar-shaped storage electrodes, forming the thin dielectric film 13. A second conductive layer is covered over the dielectric layer to form a plate electrode 14. The insulating layer 15 is formed over both the gate electrode 6 and the plate electrode 14 for isolating the plate electrode 14 from the bit line 7. The bit line 7 is formed by depositing a conductive material covering the drain region 4.

In the conventional semiconductor memory device with the villus-type capacitor structure, the storage electrode is formed by the use of a FIB method without any photolithography process, and restrictions in achieving capacitance due to design rule limitations can be overcome. However, when the FIB method is adopted to form the storage electrodes consisting of pillars, it must be separately conducted for each individual pillar-shaped unit of the electrode of every memory cell. As a result, it takes a considerable amount of time to produce a chip when using this method, and consequently lowers the productivity of the chip-making operation. The villus-type capacitor is therefore, unsuitable for mass production.

Additionally, when the semiconductor substrate 1 is annealed to grow the pillar-shaped electrodes, an impurity-dopant previously implanted in the source region and the drain region may be diffused to the lower portion of the gate electrode by the annealing process.

Thus, punch-through occurs, allowing current to directly flow without passing through channel regions, whereby the performance of the device is degraded. Furthermore, the crystalline silicon grown by the annealing process is not formed in the shape of an upright and squared-off pillar with sharp corners, but rather it becomes domed with rounded corners, making it difficult to obtain the desired capacitance.

Accordingly, there is a need for a method of manufacturing villus-type capacitors in semiconductor devices that can obtain the required capacitance of the higher integrated memory devices (64 Mb and higher) while overcoming the problems that make current villus-type capacitors unsuitable for mass production.

SUMMARY OF THE INVENTION

It is an object of the present invention to provide a method for manufacturing a semiconductor memory device with a villus-type capacitor structure capable of forming a villus-type capacitor below design rule, using conventional patterning processes, while solving the problems that exist in conventional semiconductor memory devices having villus-type capacitor structures.

To achieve these and other objects, the invention discloses a method for manufacturing a villus-type capacitor of a semiconductor memory device, by stacking a storage electrode, a dielectric film and a plate electrode on a semiconductor substrate. The method further comprises the following steps in the sequence set forth below:

forming a first conductive layer by depositing a conductive material on a semiconductor substrate;
covering the first conductive layer with a second material having grains of a first material;
selectively removing the second material using the first material grains as a mask;
etching a predetermined portion of the first conductive layer by using a grain pattern formed by removing the second material as a mask;
removing the grain pattern;
forming a storage electrode by defining, for each cell, the villus-formed first conductive layer on the surface of the device through the use of an etching process for a predetermined portion;
forming the dielectric film over the surface of the storage electrode; and
forming the plate electrode by depositing a second conductive layer over the dielectric film.

BRIEF DESCRIPTION OF THE DRAWINGS

Other objects and advantages of the present invention will become more apparent by the following description with reference to the accompanying drawings, in which.

DETAILED DESCRIPTION OF THE INVENTION

Figure 1:
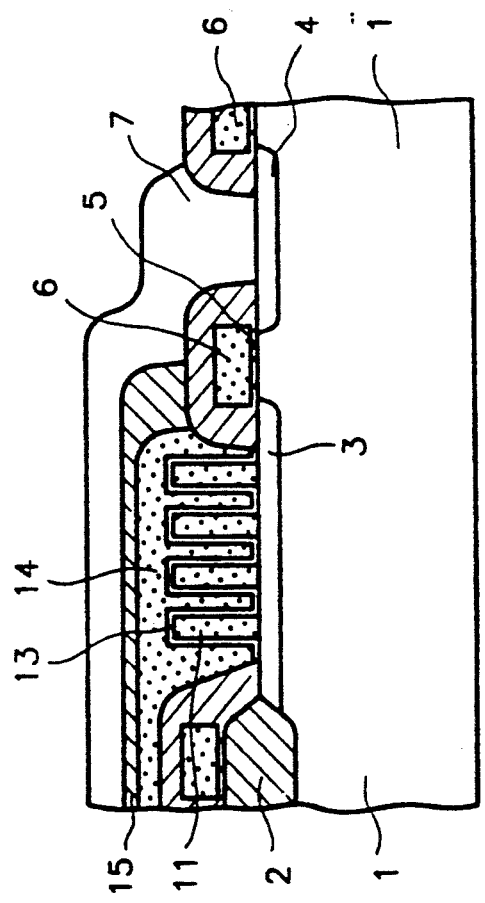
FIG. 1 is a sectional view of a conventional semiconductor memory device with a villus-type capacitor structure.

Certain reference numerals used in FIG. 1 are also used in FIGS. 2A through 2H to designate corresponding portions.

Figure 2A:
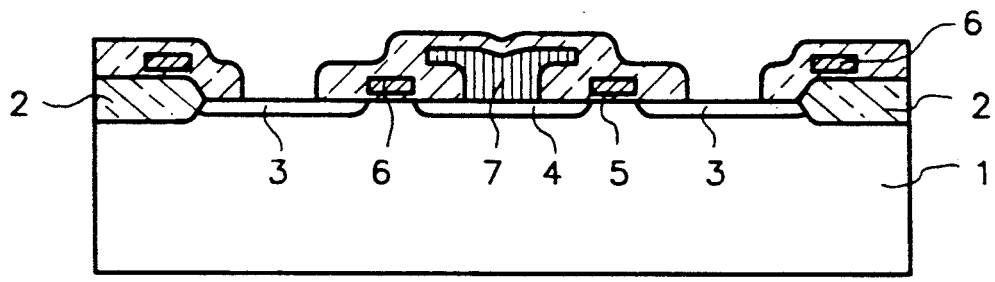
FIGS. 2A through 2H show the embodiment of the process for manufacturing a semiconductor memory device with a villus-type capacitor structure according to the present invention.

FIG. 2A illustrates a process for forming a switching transistor having a source region 3, a drain region 4 and a gate electrode 6 on an interposing gate oxide layer 5, and a bit line 7 on the drain region 4. Initially, an active region is separated from an isolation region by forming a field oxide layer 2, through the local oxidation of silicon in a semiconductor substrate 1. The electrically insulated gate electrode 6 is also formed on the active region. The source region 3 and the drain region 4 are formed by implanting an impurity in the semiconductor substrate 1 on both sides of the gate electrode 6, thereby completing the switching transistor. The bit line 7 is formed by depositing, and then etching a conductive material in contact with the drain region 4.

Figure 2B:
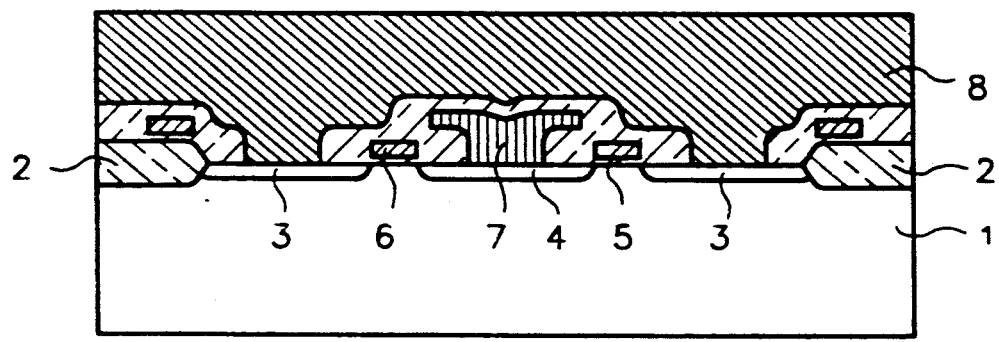

FIG. 2B illustrates a process for covering a first conductive layer over the whole surface of the switching transistor, including therein the buried bit line 7. A first conductive layer 8 may be formed for example, from an impurity-doped polycrystalline silicon deposited via CVD on the source region of the switching transistor with a thickness of about 3000Å or greater, but it is not so limited. It is preferable that the thickness of the first conductive layer, which is an important factor in determining cell capacitance, be about 5000Å.

Figure 2C:
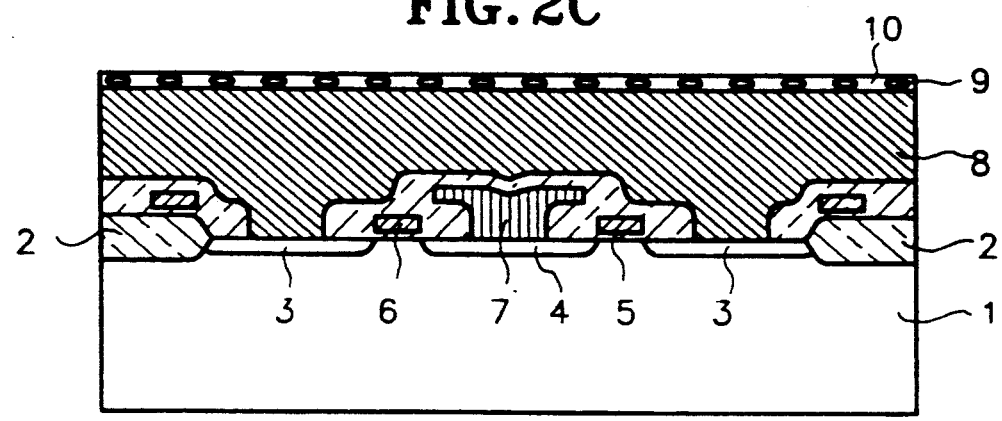

FIG. 2C illustrates a process for covering the first conductive layer with a second material 10 that mixes with the grains of a first material 9. Here, the first material may be a spherical powder of an oxide such as $SiO_2$ or $Al_2O_3$, which acts as a resistant while etching the first conductive layer. Advantageously, the second material is mixed with the grains of the first material, forming a colloidal dispersion, and is used to cover the first conductive layer. For example, the second material may contain approximately 5 to 25 grains of the first material. Being isolated from one to another per one capacitor, then a soft bake process is performed.

It should be noted that although the grains are spherical with a diameter of about 0.05 to 0.1 $\mu$m in this embodiment, the shape and size of the grains are not confined to only that of the above-mentioned embodiment. Notably, the sizes of the grains are an important factor of the cell capacitance. Also, while the second material may be mixed with a powder, it is possible to use a light-sensitive liquid as a second material, such as a photoresist or a polyimide. The first and the second materials may, for example, be grains of an oxide and a SOG (Spin On Glass) layer having high etch selectivities.

Figure 2D:
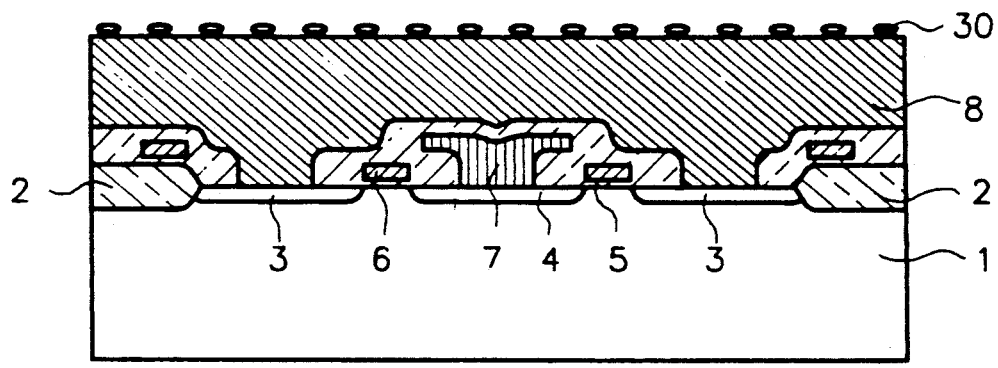

FIG. 2D illustrates a process for hard baking the device, after exposing and developing the second material. If the second material is a positive type, since the grains are opaque the second material is removed from all areas except those in which the grains are distributed (as shown by item 30 in FIG. 2D) Thereafter, the areas free from the grain distribution are exposed and developed. The hard bake is processed at a temperature of about 135° C. for 30 minutes, for the purpose of preventing the second material from damage during an etching process.

Figure 2E:
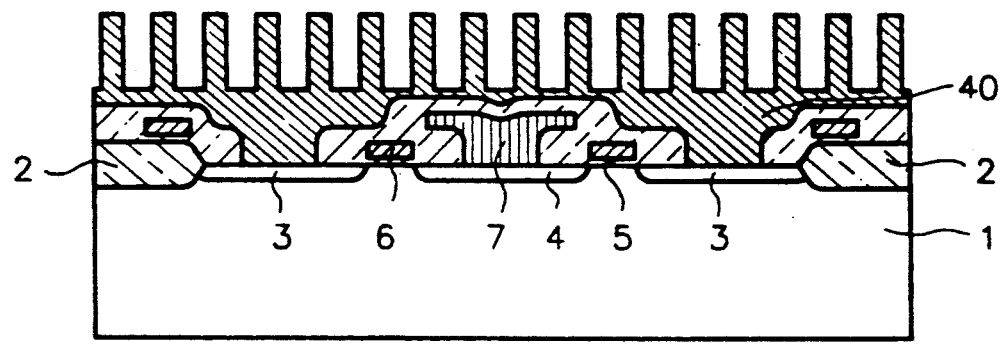

FIG. 2E illustrates the process for etching the first conductive layer 8. A villus-type electrode 40 is formed by an anisotropic etching of the first conductive layer, using the grain pattern 30 formed from the second material as a mask. It should be noted that the degree of the anisotropic etching is an important factor in adjusting the capacitance, because the cell capacitance may be adjusted by the height of the villus-type storage electrode and the size and number of grains applied to each unit area.

Figure 2F:
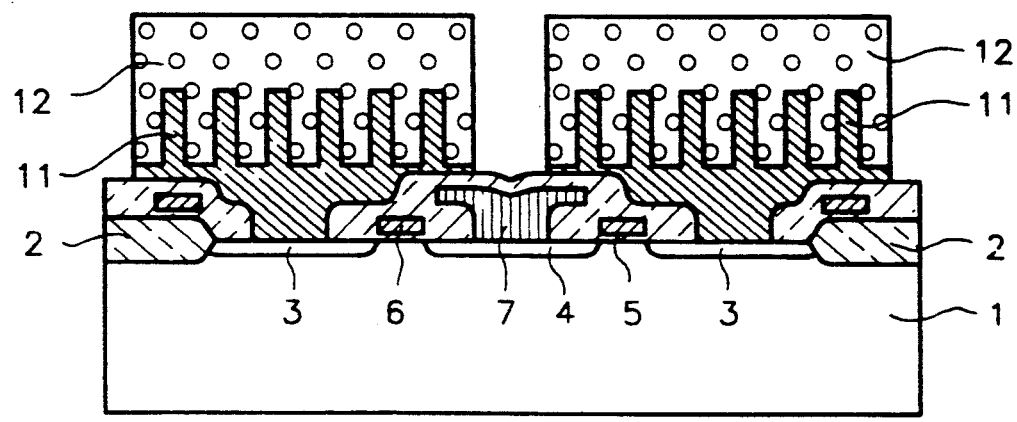

FIG. 2F illustrates a process for etching the villus-type electrode 40, such that the villus-type electrode 40 formed by the anisotropic etching is confined to the unit cell area. At first, a photoresist pattern 12 is formed over the whole surface of the villus-type electrode 40. Then, the villus-type electrode 40 is selectively etched so as to define the storage electrode 11 into each unit cell.

Figure 2G:
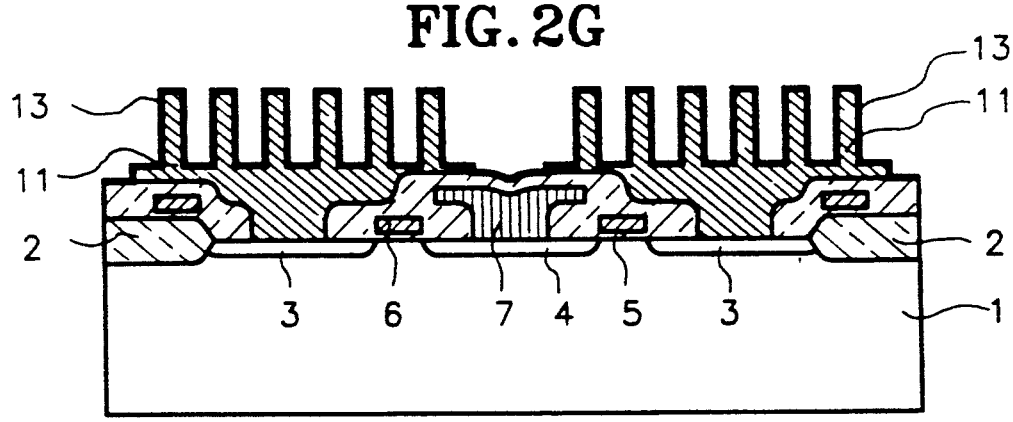

FIG. 2G illustrates the next step, which is a process for forming a dielectric film over the whole surface of the resultant substrate, by coating a dielectric material thereon. The dielectric film is coated utilizing CVD methods to obtain a predetermined thickness, preferably, about 50 to 150A, but not so limited. It is important to note that the thinner the dielectric film, the more capacitance obtained. However, if the dielectric film is too thin current leakage through the dielectric film may occur. Therefore, to prevent the current leakage, a minimum requisite thickness should be maintained and dielectric materials having a high dielectric constant such as $SiO_2$, $Si_3N_4$, $Ta_2O_5$ and the like, are used for 64 Mbit and 256 Mbit DRAMs.

Figure 2H:
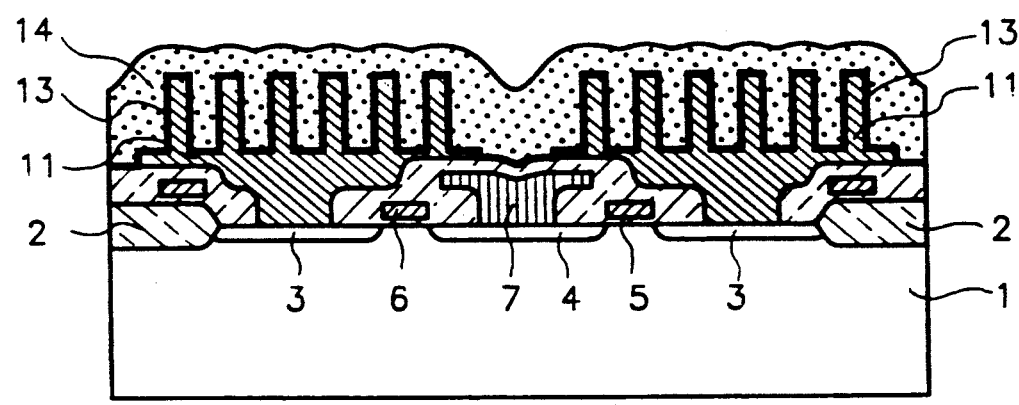

FIG. 2H illustrates a process for forming a plate electrode 14 by depositing a second conductive layer. The second conductive layer such as an impurity-doped polycrystalline silicon covers the whole surface of the substrate on which the dielectric film is coated, thereby forming the plate electrode 14.

Figure 3:
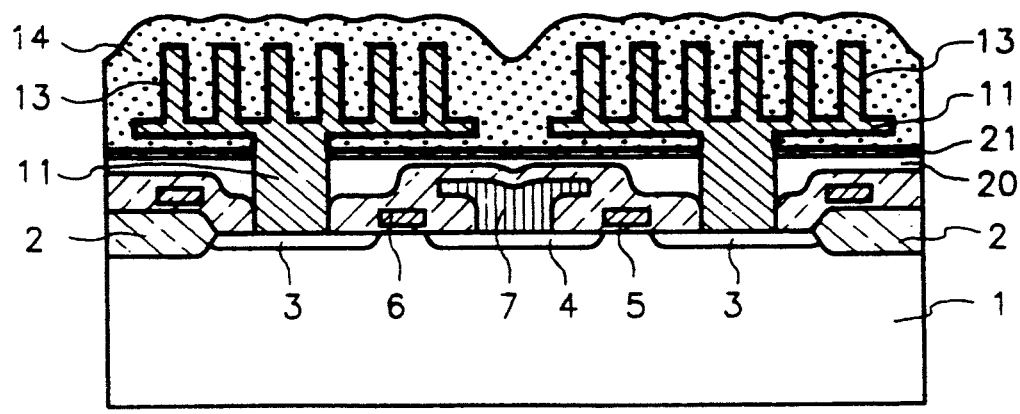
FIG. 3 is a sectional view of another embodiment of a semiconductor memory device with a villus-type capacitor structure according to the present invention.

FIG. 3 is a vertical sectional view of another embodiment of a semiconductor memory device having a villus-type capacitor structure, in which the bottom surface of the storage electrode is also utilized as an effective capacitance area. Advantageously, greater capacitance may be obtained, as compared with the above mentioned embodiment of the present invention.

The process for forming a semiconductor memory device with a villus-type capacitor according to a second embodiment of the present invention is as follows: a bit line 7 is formed on a drain region 4 of a switching transistor. A planarizing layer 20, an etch-blocking layer 21, and an insulating layer (not shown) are sequentially formed on the resultant structure. Thereafter, a contact hole is formed into the stacked structure. A first conductive layer is thickly deposited over the whole surface of the resultant structure, forming the base of a storage electrode 11. From this point on, the method employed for the manufacturing of the storage electrode 11 is identical to the method described above in connection with the first embodiment, and need not be repeated here. After forming the storage electrode 11, the forming of the capacitor described in the second embodiment is completed by removing the insulating layer formed under the storage electrode using commonly known wet etching techniques.

Expressed differently, in the semiconductor memory device having the above-described villus-type capacitor, after the opaque grains of the first material mixed with the second material are covered, the capacitor is formed utilizing the grains as a mask. The villus-type storage electrode comprising the pillar-shaped electrodes having dimensions below design rules is then formed, with the bit line being formed before the formation of the capacitor. Advantageously, the capacitor is not limited to the source region, but extends over the field oxide layer and gate electrode, increasing its capacitance. Additionally, the problems produced by the annealing process used in other methods are eliminated, resulting in improved electrical characteristics of the device. Finally, because the storage electrode is formed by a single photolithography process, the method described herein may be suitable for mass production. As noted, the capacitance may be adjusted as desired, in accordance with the height of the storage electrode, the size of the grains, and the grain density per unit area, resulting in a manufacturing method that is preferable for higher packing densities.

While the invention has been described in detail with particular reference to the specific embodiments herein, it will be apparent that many modifications and variations may be easily effected by one skilled in the art without departing from the spirit or scope of the novel concepts of the present invention, as defined in the appended claims.

What is claimed is:

1. A method for manufacturing a semiconductor memory device with a capacitor by stacking a storage electrode, a dielectric film and a plate electrode on a semiconductor substrate, said method further comprising the steps of:

forming a first conductive layer by depositing a conductive material on said semiconductor substrate;

covering the first conductive layer with a glass material which includes grains of an oxide;

selectively removing said glass material using said oxide material grains as a mask;

etching said first conductive layer using a grain pattern formed by removing said glass material as a mask;

removing said grain pattern;

completing the formation of a storage electrode by defining said first conductive layers formed as villi on the surface of the resultant structure into each unit cell utilizing an etching process;

forming said dielectric film over the surface of said storage electrode; and forming said plate electrode by depositing a second conductive layer over said dielectric film.

2. A method for manufacturing a semiconductor memory device with a capacitor as claimed in claim 1, wherein said oxide is either one of the group consisting of $SiO_2$ and $Al_2O_3$.

3. A method for manufacturing a semiconductor memory device with a capacitor as claimed in claim 1, wherein said glass is an SOG (Spin On Glass).

4. A method for manufacturing a semiconductor memory device with a capacitor as claimed in claim 1, wherein said capacitor is utilized as a cell capacitor of a highly integrated DRAM.

5. A method for manufacturing a semiconductor memory device with a capacitor as claimed in claim 4, wherein said oxide grains have a diameter of about 0.05 to 0.1 $\mu$m.

6. A method for manufacturing a semiconductor memory device with a capacitor as claimed in claim 4, wherein said conductive material is an impurity-doped polycrystalline silicon.

7. A method for manufacturing a semiconductor memory device with a capacitor as claimed in claim 4, wherein said storage electrodes defined into each unit cell, comprise about 5 to 25 pillar-shaped electrodes.

* * * * *